United States Patent [19]

Yokoyama et al.

[11] Patent Number: 4,810,967
[45] Date of Patent: Mar. 7, 1989

[54] POSITION SENSOR FOR DETECTING ANGULAR POSITION

[75] Inventors: Toshio Yokoyama; Iwao Shimane; Tsuneo Konno, all of Saitama, Japan

[73] Assignee: Honda Giken Kogyo Kabushiki Kaisha, Tokyo, Japan

[21] Appl. No.: 27,833

[22] Filed: Mar. 19, 1987

[51] Int. Cl.⁴ .............................................. G01B 7/30
[52] U.S. Cl. .................................. 324/208; 123/617; 123/146.5 A; 324/262
[58] Field of Search ............... 324/207, 208, 226, 252, 324/251, 260–262, 173, 174, 381, 385, 389, 402; 338/32 R, 32 H; 310/168; 123/617, 146.5 A

[56] References Cited

U.S. PATENT DOCUMENTS

| | | | |
|---|---|---|---|
| 4,053,826 | 10/1977 | Wasawa et al. | 324/208 |
| 4,274,053 | 6/1981 | Ito et al. | 324/174 |
| 4,319,188 | 3/1982 | Ito et al. | 324/208 X |
| 4,401,944 | 8/1983 | Narimatsu et al. | 324/207 |
| 4,589,038 | 5/1986 | Radtke | 324/207 X |
| 4,599,561 | 7/1986 | Takahashi et al. | 324/252 X |
| 4,649,342 | 3/1987 | Nakamura | 324/252 X |

FOREIGN PATENT DOCUMENTS

| | | | |
|---|---|---|---|
| 0196619 | 10/1985 | Japan | 324/208 |
| 0214219 | 10/1985 | Japan | 324/208 |

Primary Examiner—Reinhard J. Eisenzopf
Assistant Examiner—Warren S. Edmonds
Attorney, Agent, or Firm—Lyon & Lyon

[57] ABSTRACT

A light, compact angle-of-rotation sensor is provided that is comprised of a magnetic ring bonded to a shaft by means of resin. The magnetic ring is provided around its periphery with a number of magnetized zones, with each such magnetized zone having a different number of magnetic poles, and magnetic interference between magnetized zones is prevented by leaving non-magnetized spaces between the magnetized zones. The prevention of magnetic interference can be further enhanced by the provision of non-magnetized portions between the magnetic poles of the magnetized zones.

7 Claims, 9 Drawing Sheets

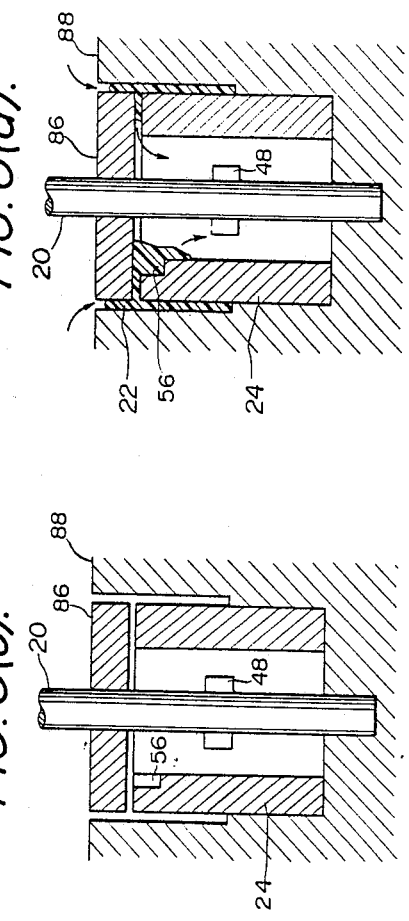
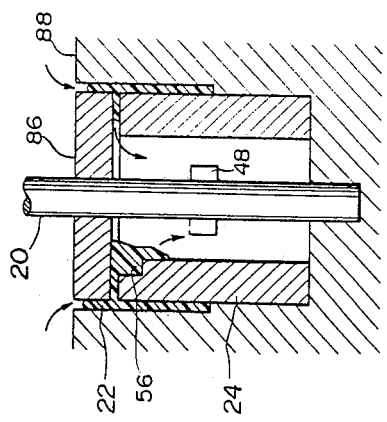
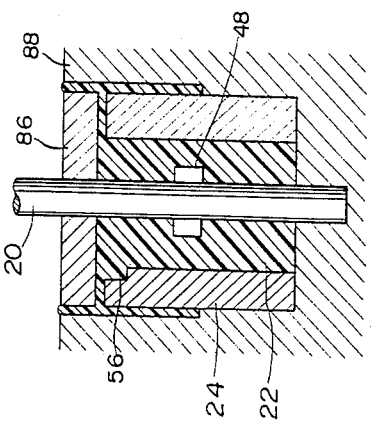
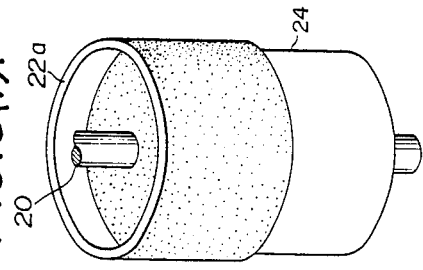
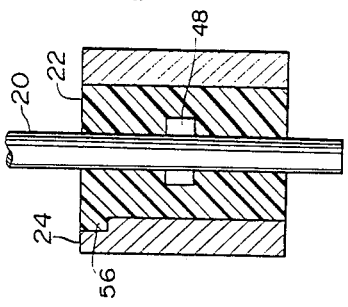
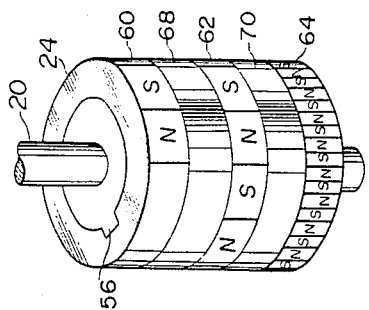

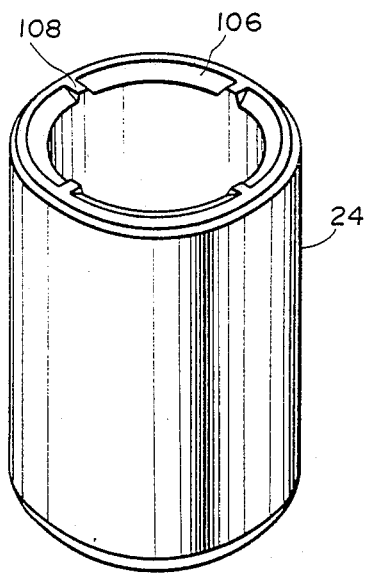
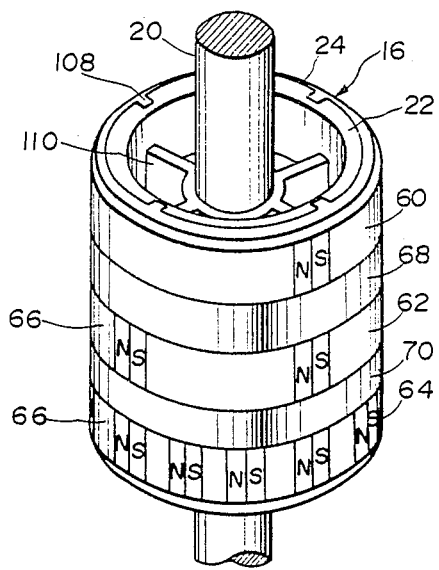

POSITION SENSOR FOR DETECTING ANGULAR POSITION

BACKGROUND OF THE INVENTION

1. Field of the Invention

This invention relates to an angle-of-rotation sensor for detecting the angle of rotation of a shaft. This invention particularly relates to an angle-of-rotation sensor for detecting the angle of rotation of the crankshaft of an internal combustion engine of an automobile or other such vehicle.

2. Description of the Prior Art

Recently, electronic control technology for internal combustion engines has been making rapid progress. With respect to such electronic control, control timing is important and as such it is necessary to detect with precision piston crank angle positions for use as reference signals. Conventional types of angle-of-rotation sensors include, for example, the type disclosed in Japanese Laid-open Patent Publication No. 57(1982)-133311. In this conventional technology a rotating member is formed by stacking three disk-shaped magnets one on top of the other. Each of the magnets has magnetic poles formed contiguously around the periphery thereof, forming three arrays of magnetized zones. However, because in such an arrangement the magnetized zones are in close, continuous contact in the direction of the axis of rotation with non-magnetized zones provided therebetween, there is a risk of magnetic interference arising between the magnetized zones, and the magnetic flux path of one magnetized zone disturbing the magnetic poles of an adjacent magnetized zone and the magnetic force thereby produced giving rise to detection errors, for which reason it has not been possible to detect accurately the crank angle position. The risk becomes particularly strong when a high-sensitivity device such as a magneto resistor is used as the detection means.

In addition, because in this conventional type the rotating member is formed by stacking together disk-shaped magnets, the rotating member becomes heavy, so the diameter of the shaft has to be increased, with the result that other parts such as the bearings have had to be made large, so that overall the sensor becomes large and heavy, requiring a large space to house it in and causing a degradation in durability.

SUMMARY OF THE INVENTION

An object of this invention is to provide an angle-of-rotation sensor that can prevent magnetic interference arising between magnetized zones and enables a crank angle position to be detected accurately.

Another object of this invention is to provide an angle-of-rotation sensor which is light and compact, can be contained in a small space and has good durability.

To attain the aforesaid objectives, the present invention provides an angle-of-rotation sensor provided with a rotating member which rotates synchronously with the rotation of a subject shaft to be measured, said rotating member having formed on its peripheral surface a plurality of magnetized zones arrayed in the direction of the axis of rotation, said magnetized zones each having a different number of magnetic poles, and the same number of magneto electric transducer means as there are magnetized zones arranged facing the said rotating member, the improvement comprises said angle-of-rotation sensor is provided with a non-magnetized zone between the said magnetized zones.

BRIEF DESCRIPTION OF THE DRAWINGS

The above and other features of the present invention will become apparent from the following description made with reference to the drawings, in which:

FIGS. 6(a) to 6(h) are explanatory views showing the manufacturing sequence for the angle-of-rotation sensor according to the present invention;

FIG. 8 is an explanatory perspective view of a third embodiment of the angle-of-rotation sensor according to this invention;

FIG. 10 is an explanatory perspective view of the magnetic ring employed in the third employment.

DESCRIPTION OF THE PREFERRED EMBODIMENTS

Embodiments of the invention will now be described with reference to the drawings.

Figure 1:
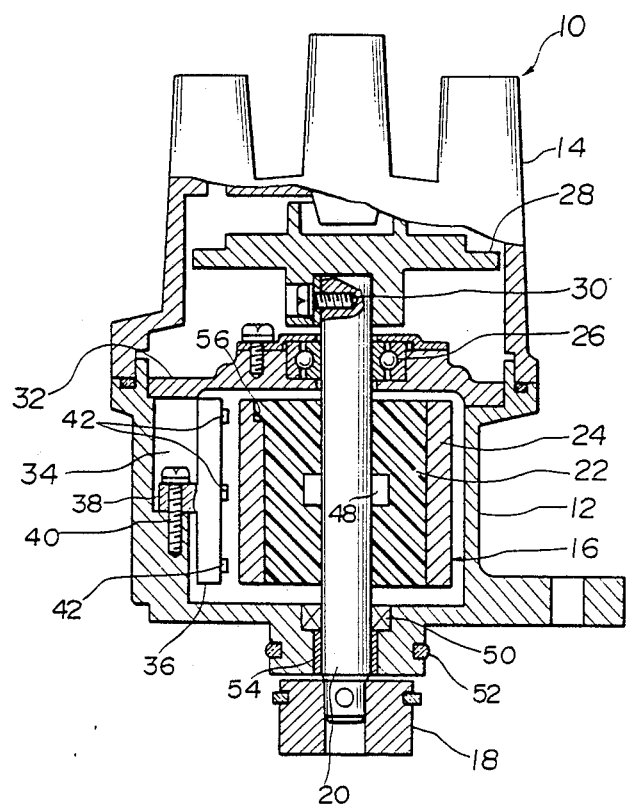
FIG. 1 is an explanatory cross-sectional view showing the angle-of-rotation sensor according to the present invention, provided as an example inside a distributor.

With reference to FIG. 1 and the overall structure, an example of the angle-of-rotation sensor is shown provided within a distributor 10. A housing 12 and a distributor cap 14 that fits onto the upper part of the housing 12 form the casing of the distributor 10 within which a rotating member 16 is rotatably housed. The rotating member 16 is comprised of a shaft 20 which is coupled via a joint 18 to a camshaft (not shown) which rotates synchronously with the rotation of a crankshaft (not shown) of an internal combustion engine at one-half the revolutions thereof, and a magnetic ring 24, described hereinbelow, which is affixed on said shaft 20 coaxially therewith by means of a thermosetting resin 22 such as a phenol resin or the like. The rotating member 16 is supported by a bearing 26 inside the distributor 10 so as to be freely rotatable, and has at the upper end thereof a rotor 28 affixed thereto by a screw 30.

Figure 2A:
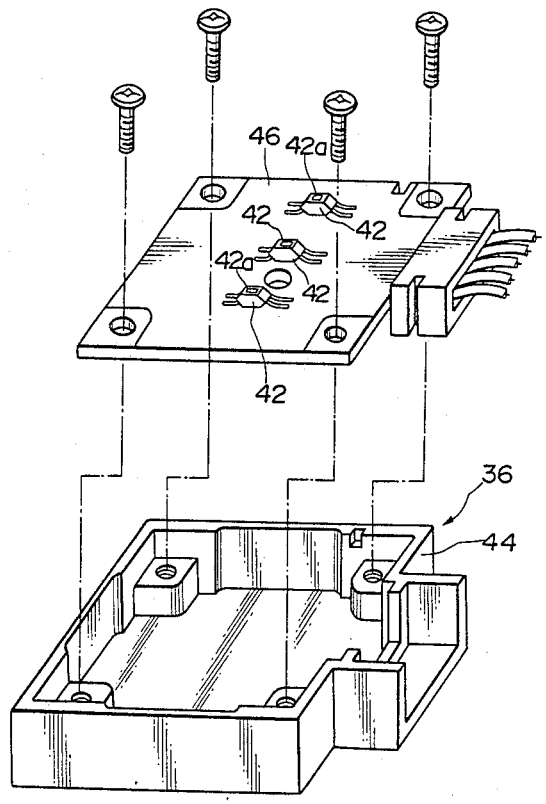
FIGS. 2(a) and 2(b) are explanatory perspective views showing details of a sensor board employed in the angle-of-rotation sensor of this invention.
Figure 2B:
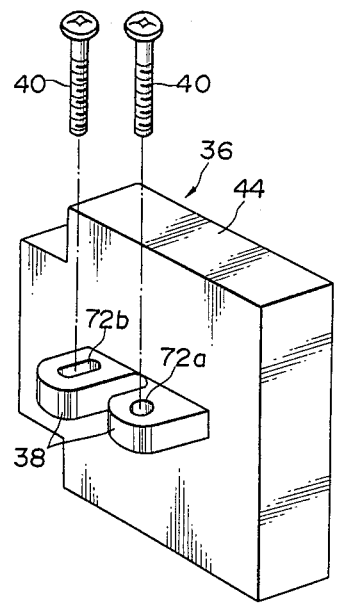

The magnetic ring 24 is rotatably located in a chamber 34 formed by a partition 32. A sensor board 36 in the chamber 34 which is separated from the outer peripheral surface of the magnetic ring 24 by a specific distance is fixed to the housing 12 by means of a bracket 38 and screws 40. The sensor board 36 is provided with three Hall elements 42 acting as the magneto electric transducer means, said Hall elements being arranged in opposition to the magnetized zones formed on the magnetic ring. As shown in FIGS. 2(a) and 2(b), the sensor board 36 is provided with a casing 44 which houses a circuit board 46. On the outer surface of the circuit board 46 are affixed only the three Hall elements 42 with the magneto-sensitive surface 42a thereof exposed. Detection circuitry (to be described later) such as the amplifier circuitry and the like are affixed to the reverse side of the circuit board 46.

Although in this embodiment Hall elements are used for the magneto electric transducer means, it is to be understood that it would be precisely the same if magneto resistors or the like were used. The numeral 48 denotes a retainer key, 50 an oil seal, 52 an O-ring and 54 a bearing metal. The numeral 56 denotes a recess which is poured with the resin 22 in order to prevent any slip between the magnetic ring 24 and the shaft 20 together with the retainer key 48.

Figure 3:
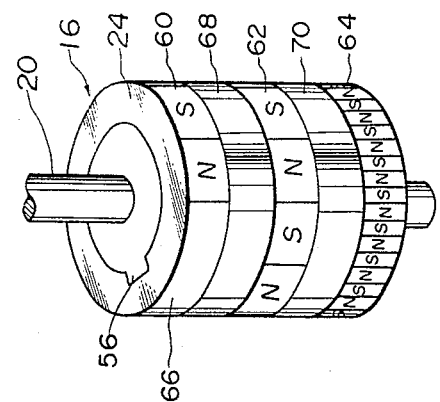
FIG. 3 is an explanatory perspective view of the rotating member of the angle-of-rotation sensor shown in FIG. 1.

The rotating member 16 will now be described in further detail with reference to FIGS. 3 and 4. The magnetic ring 24 which forms the rotating member 16 is tubular in shape and has formed on the periphery thereof, in the direction of the axis of rotation of the magnetic ring, a plurality of magnetized zones. In the diagram, there are three such zones, a first magnetized zone 60, a second magnetized zone 62 and a third magnetized zone 64. On the circumference of these magnetized zones are formed an appropriate number of magnetic poles consisting of N poles and S poles. Assuming that the angle-of-rotation sensor according to the present invention is fitted to a 4-cylinder internal combustion engine, the first magnetized zone 60 will have one pair of poles, the second magnetized zone 62 will have four pairs of poles and the third magnetized zone 64 will have twenty-four pairs of poles (for ease of understanding the third magnetized zone is shown with fewer magnetic poles). The N poles and S poles do not have to be identical in peripheral length, but may be varied suitably in accordance with the output duty value. As the first magnetized zone 60 has only one pair of magnetic poles, the remaining part has been made a non-magnetized portion 66.

One of the characterizing feature of the present invention is that non-magnetized zones are interposed between the magnetized zones 60, 62 and 64; in the diagram these are shown as first non-magnetized zone 68 and a second non-magnetized zone 70. The presence of the non-magnetized zones prevents the magnetic force of one magnetized zone affecting an adjacent magnetized zone. Hence, with mutual magnetic interference between the magnetized zones 60, 62 and 64 being prevented, each magnetized zone can maintain an adequate coercive force. Although the presence of the non-magnetized portion 66 on the first magnetized zone makes said zone more prone to magnetic interference from the second magnetized zone, because there is a non-magnetized zone separating these magnetized zones, magnetic interference is prevented even with respect to the non-magnetized zone. The magnetized zones 60 and 64 are formed right to the respective ends of the magnetic ring 24 to make the axial length of the magnetic ring as short as possible. The width of the non-magnetized zones 68 and 70 in the direction of the axis of rotation may be the same as that of the magnetized zones 60, 62 and 64, or may be less or more than said width, as required.

Figure 4:
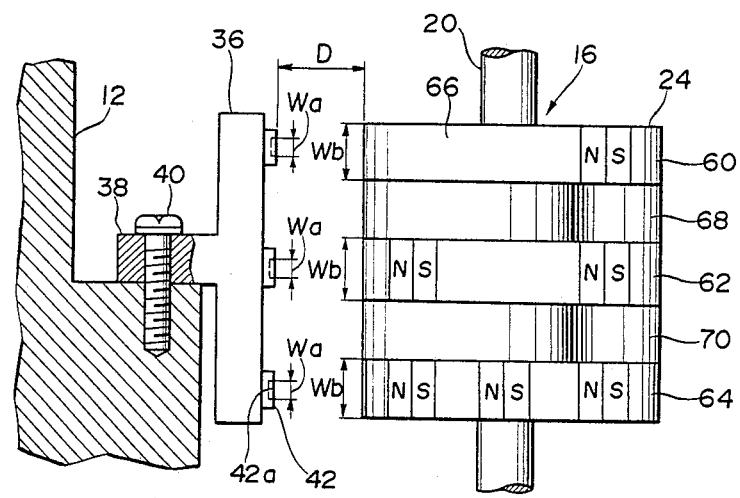
FIG. 4 is an explanatory side view showing the positional relationship of the rotating member and the sensor board.

With reference to FIG. 4, in the angle-of-rotation sensor according to this invention, the width of each of the magnetized zones 60, 62 and 64 in the direction of the axis of rotation is greater than the width of the magneto-sensitive surface 42a of the Hall elements 42. If the width of the magneto-sensitive surface 42a of the Hall elements 42 in FIG. 4 is taken as Wa and the width of the magnetized zones 60, 62 and 64 as Wb, then $$Wb > Wa + a$$

Here, a is a dimensional allowance for an estimated overall error that is the sum of errors arising in the fabrication and assembly of the distributor housing 12, sensor board 36, and the like. As an example, it will be assumed that Wa is 0.8 mm, a is 4.0 mm and Wb is 5.0 mm. That is, although in order to obtain the desired detection output it is necessary for the magneto-sensitive surface of each of the Hall elements to be located in opposition to the respective magnetized zones and spaced away therefrom by the specified distance for accurate correspondence therewith, because the magnetized zones and the Hall elements are extremely small and the alignment is therefore difficult, by constructing it thus, positioning may be carried out using an assembly allowance a, the complexity of the positioning operation is alleviated and production efficiency and fitting operation efficiency are improved.

Moreover, regarding the positioning arrangement of the Hall elements 42 and the magnetized zones 60, 62 and 64, with respect to the magnetic ring 24, the dimensions of the gap D therebetween must be set strictly in the perpendicular direction, i.e., in the direction of the axis of rotation, and also in the horizontal direction (FIG. 4), for example, from 0.3 mm to 0.5 mm. However, in the angle-of-rotation sensor of the present invention, as shown in FIG. 2(b), of the through-holes 72a and 72b formed in the bracket 38 of the sensor board 36 for the passage of screws 40, the hole 72b is formed as a slot, so that the casing 44 can pivot slightly about the other hole 72a, thereby allowing fine adjustment of the gap D to be carried out.

The functioning of the angle-of-rotation sensor according to the present invention will now be explained hereinbelow.

Figure 5:
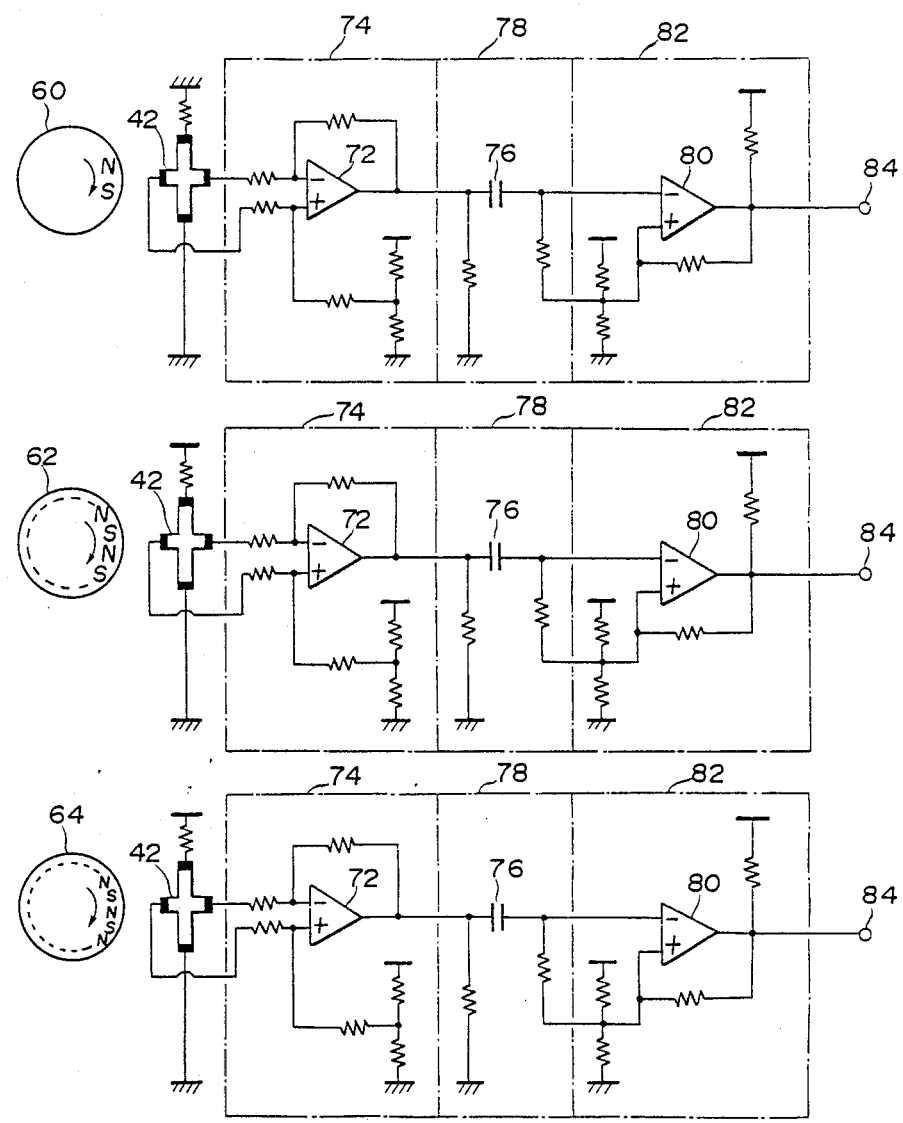
FIG. 5 is a block diagram of the detection circuit of the angle-of-rotation sensor shown in FIG. 1.

With reference to FIG. 5, a sensor board 36 that is provided in the proximity of the rotating member 16 that rotates one-half revolution for every one revolution of an internal combustion engine crankshaft (not shown) is provided thereon with three Hall elements 42 in which an electric voltage is produced upon being subjected to the magnetic fields of the magnetized zones 60, 62 and 64 of the magnetic ring 24. The output of each of the Hall elements 42 is passed through an amplification circuit 74 that is provided with a differential amplifier 72, a direct current component filter circuit 78 provided with a coupling capacitor 76, and a comparator circuit 82 provided with a comparator 80, and is taken off via output terminals 84 and transmitted to an after-processing circuit (not shown). One pulse is obtained from the first magnetized zone 60 per crank revolution of 720 degrees for use as a cylinder discrimination signal, one pulse is obtained from the second magnetized zone 62 per crank revolution of 180 degrees for use as a piston TDC position signal, and one pulse is obtained from the third magnetized zone 64 per crank revolution of 30 degrees for use as a unit angle signal, and on the basis of these angle signals the internal combustion engine (not shown) may be controlled with good precision.

Although the outputs of the three Hall elements differ in frequency and phase, if during the magnetization of the magnetized zones the magnetizing force is suitably changed for each magnetized zone so as to result in the generation of a uniform output voltage, it becomes possible to use the same components for the circuits 74, 78 and 82, i.e., it becomes unnecessary to change resistance values and the like, and the bias voltage and the like can also be made the same.

Figure 6A:
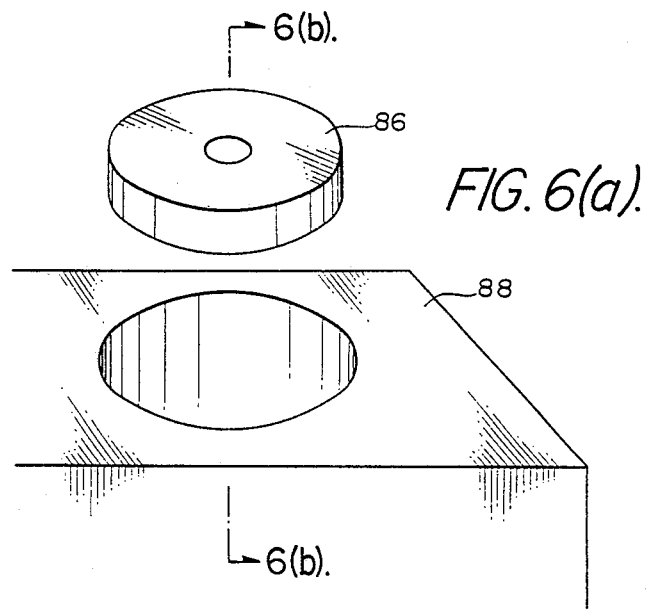
Figure 6B:
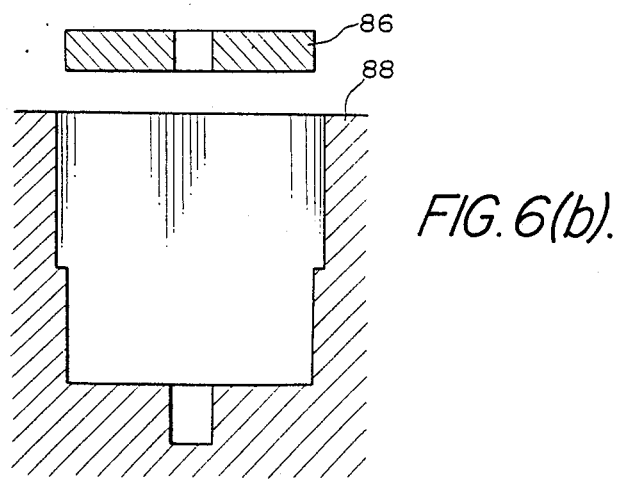

The method of manufacturing the angle-of-rotation sensor of this invention will now be described, with reference to FIGS. 6(a) to 6(h). An upper die half 86 and a lower die half 88 are prepared (FIGS. 6(a) and 6(b)), and a ferrite magnetic ring 24 which has not yet been magnetized is inserted with the shaft 20 into the lower die half 88, and the upper die half 86 is placed on top (FIG. 6(c)). A liquified plastic resin 22 such as phenol resin is then fed in via an inlet (FIG. 6(d)), and left to cool after the die has been completely filled therewith (FIG. 6(e)). Following this, the member is taken out of the die and the adhering resin 22a (FIG. 6(f)) is machined off on a lathe or the like to form the rotating member as shown in FIG. 6(g), the rotating member then being completed by the formation of magnetized zones and non-magnetized zones around the periphery of the magnetic ring (FIG. 6(h)).

Figure 7A:
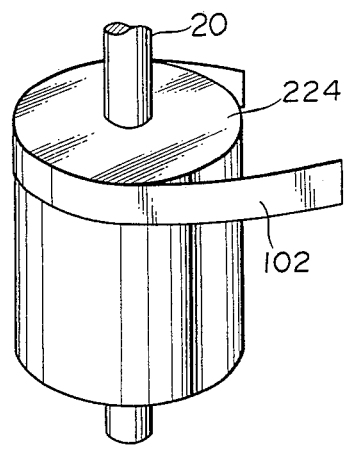
FIGS. 7(a) and 7(b) are explanatory perspective views of a second embodiment of the angle-of-rotation sensor according to the present invention.
Figure 7B:
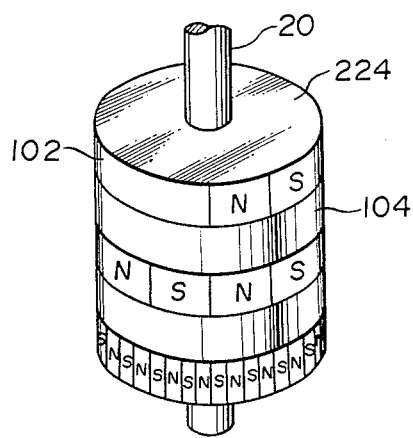

FIGS. 7(a) and 7(b) show a second embodiment of an angle-of-rotation sensor according to this invention, in which in place of the magnetic ring there is used a tubular member 224 formed of a light, non-magnetic material such as plastic, magnetization being provided by wrapping magnetic tape 102 around the circumference thereof. The merits of this are that fabrication is easy, the rotating member 16 can be made light and durability is improved. In this embodiment, the portion 104 which is not wrapped with the magnetic tape 102 forms the aforesaid non-magnetized zones.

Figure 9:
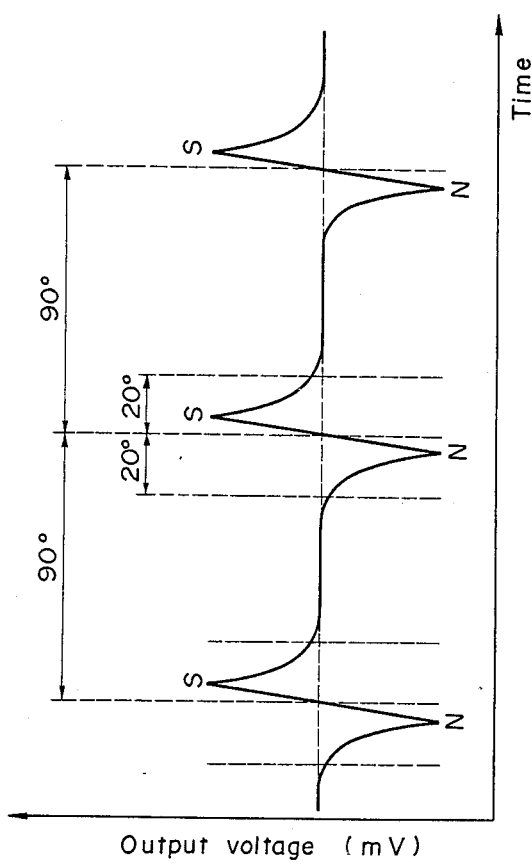
FIG. 9 is an explanatory waveform diagram relating to the ratio of distribution of the width of the magnetized portions of the magnetized zones of the sensor shown in FIG. 8 to that of the non-magnetized portions in the peripheral direction.

FIGS. 8 to 10 show a third embodiment of the angle-of-rotation sensor according to this invention. The explanation of this embodiment will focus on the differences with the previous embodiments. The magnetic ring 24 which forms the rotating member 16 has provided around the periphery thereof magnetized zones 60, 62 and 64 and non-magnetized zones 68 and 70, and each of the magnetized zones, in particular the magnetized zones 62 and 64, has non-magnetized portions 66 interposed between the magnetic poles, for the same purpose. The peripheral length distribution of the non-magnetized zones 66 and the magnetic poles may be set to any value as long as it provides an output of the time-width required for allowing current to flow from a battery (not shown) to power transistors in an igniter of an ignition device (not shown). As shown for example in FIG. 9, if there is a difference in the angle-of-rotation of 90 degrees between detection signals, the length of the N and S magnetic poles in the direction of rotation expressed as an angle will be 20 degrees. With reference to FIG. 10, in the case of the magnetic ring of the angle-of-rotation sensor of this embodiment, the rim of the magnetic ring 24 has a tapered face 106 onto which the resin 22 flows, in addition to which projecting portions 108 are formed at four places on the tapered face 106, providing strong affixment between the resin 22 and the magnetic ring 24. The shaft is also provided with the retainer key as in the first embodiment. To further reduce weight, in the third embodiment the amount of resin 22 that is used is reduced and a hollow structure employed with ribs 110 being provided at each end.

Although in the foregoing the angle-of-rotation sensor according to this invention has been described with reference to the sensor used in an internal combustion engine, it is not limited thereto but may be applied to angle-of-rotation detection in machine tools and other machinery and equipment.

The present invention has thus been shown and described with reference to specific embodiments. However, it should be noted that the present invention is in no way limited to the details of the described arrangements but changes and modifications may be made without departing from the scope of the appended claims.

What is claimed is:

1. A crankshaft position sensor for measuring angular position of a crankshaft of a multi-cylindered internal combustion engine, comprising:

(a) a magnetic tubular member comprised of a ferrite material having a center shaft fixed coaxially therewith, said tubular member being rotatable synchronously with the rotation of the engine crankshaft and having a plurality of magnetized zones arrayed along an axis of rotation formed on its peripheral surface, one of said magnetized zones having a pair of magnetic poles and the others having a plurality of pairs of magnetic poles not less than the number of cylinders of the engine, said magnetized zones each having a non-magnetized portion interposed between the magnetic pole pairs in the direction of rotation and sandwiching a non-magnetized zone along the axis of rotation, each said non-magnetized zone having a width along the axis of rotation not less than that of each of said magnetized zones; and (b) a plurality of magneto electric transducer means in a number of same as that of said magnetized zones arrayed along the axis of rotation and disposed on a stationary member independent of said rotating tubular member while facing said rotating tubular member at a predetermined distance, said magneto electric transducer means having a magneto-sensitive surface which is greater in width along the axis of rotation than each of said magnetized zone.

2. A crankshaft position sensor according to claim 1, wherein said non-magnetized portion interposed between the magnetic pole pairs is greater in length in the direction of rotation than said magnetic poles.

3. A crankshaft position sensor according to claim 2, wherein each of said magnetized zones is provided with a magnetic force that is different from that of the other magnetized zones.

4. A crankshaft position sensor according to claim 1, further including means for adjusting distance between said magneto electric transducer means and said rotating member.

5. A crankshaft position sensor according to claim 4, wherein said adjusting means comprises:

a casing which receives said magneto electric transducer means thereon;

a bracket formed at a wall of said casing having a slot penetrating therethrough; and a fastener which fixes the casing on said stationary member through the slot, whereby the casing is movable on said stationary member along the slot to adjust the distance to said predetermined value.

6. A crankshaft position sensor according to any one of claims 1-5, wherein said magneto electric transducer means are Hall effect elements.

7. A crankshaft position sensor according to claim 1 wherein said multi-cylinder engine has four cylinders and said magnetic ring is comprised of three of said magnetic zones, a first zone having one pair of magnetic poles, a second zone having four pairs of magnetic poles, and a third zone having twenty-four magnetic poles.

* * * * *